(12) United States Patent
Kanayama (10) Patent No.: US 6,448,533 B1
(45) Date of Patent: Sep. 10, 2002

(54) METHOD OF REPAIRING DISCONNECTED WIRING AND MULTILEVEL WIRING STRUCTURE

(75) Inventor: Yasufumi Kanayama, Tottori (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/425,464

(22) Filed: Oct. 22, 1999

(30) Foreign Application Priority Data

Oct. 30, 1998 (JP) ............................................ 10-310273
Oct. 14, 1999 (JP) ............................................ 11-292546

(51) Int. Cl.⁷ ........................ B23K 26/20; B23K 26/38; G09F 9/35
(52) U.S. Cl. ............................ 219/121.64; 219/121.71
(58) Field of Search ..................... 219/121.64, 121.67, 219/121.7, 121.71, 121.72; 228/119

(56) References Cited

U.S. PATENT DOCUMENTS

| | | | | |
|---|---|---|---|---|
| 5,466,908 A | * | 11/1995 | Hosoya et al. ......... | 219/121.73 |
| 5,506,499 A | * | 4/1996 | Puar ........................... | 29/847 |
| 6,180,993 B1 | * | 1/2001 | Wang et al. ............... | 257/529 |
| 6,222,156 B1 | * | 4/2001 | Datta ....................... | 219/121.68 |
| 6,255,144 B1 | * | 7/2001 | Jeon et al. ................. | 438/131 |

FOREIGN PATENT DOCUMENTS

JP 63183481 7/1988

* cited by examiner

*Primary Examiner*—Samuel M. Heinrich
(74) *Attorney, Agent, or Firm*—Greer, Burns & Crain, Ltd.

(57) ABSTRACT

A method of repairing a disconnected wiring, which has a step of connecting a main wiring in which disconnection is caused and a spare wiring which is formed on or under the main wiring via an interlayer insulating film in their intersecting region of the main and spare wirings, comprising the steps of opening a hole by irradiating a laser beam of a first output intensity from a laser to the intersecting region of the main wiring and the spare wiring, and connecting the spare wiring and the main wiring by melting a part of the spare wiring and the main wiring by irradiating a laser beam of a second output intensity, which is different from the first output intensity, toward the hole.

10 Claims, 14 Drawing Sheets

METHOD OF REPAIRING DISCONNECTED WIRING AND MULTILEVEL WIRING STRUCTURE

BACKGROUND OF THE INVENTION

1. Field of the Invention

The present invention relates to a method of repairing a disconnected wiring and a multilevel wiring structure and, more particularly, a method of repairing a disconnected wiring to recover a function of the disconnected wiring when the wiring is disconnected, and a multilevel wiring structure.

2. Description of the Prior Art

The development of flat displays such as LCD (Liquid Crystal Display), PDP (Plasma Display Panel), FED (Field Emission Display), etc. has advanced since such flat displays can be increased in size without an increase of their depth, as opposed to the CRT. Such flat displays have begun to acquire a market. Although their principle and structure employed to display the image are different respectively, such flat displays are common in that wirings are formed around a pixel.

In such display panels, sometimes wirings are disconnected in manufacturing steps. Such disconnection brings about the pixel defect to cause reduction in yield.

Therefore, in the display panel, a spare wiring is provided in a peripheral region of a display region to relieve the defective wiring. In case the disconnection of the wiring is present, the signal can be transmitted to a wiring route, through which the signal cannot be passed because of the disconnection, via the spare wiring. Thus, yield in manufacturing the display panel can be improved.

For example, in the LCD, one end of a drain bus line is connected to a signal driver. As a countermeasure against the disconnection of the drain bus line, such a repair method can be adopted that both end portions of the drain bus line are connected via the spare wiring to relieve the defect of the drain bus line.

Figure 1A:
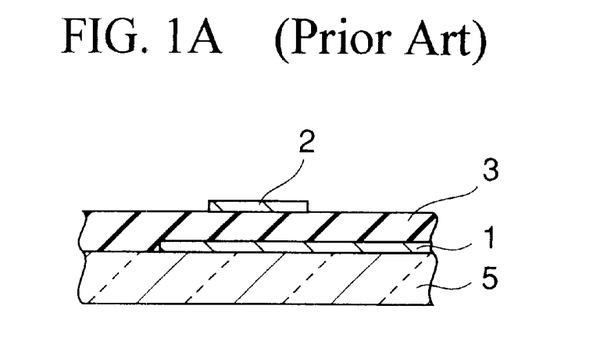
FIG. 1A is a sectional view showing a normal arrangement of a bus line and a spare wiring of a displaying device.
Figure 1B:
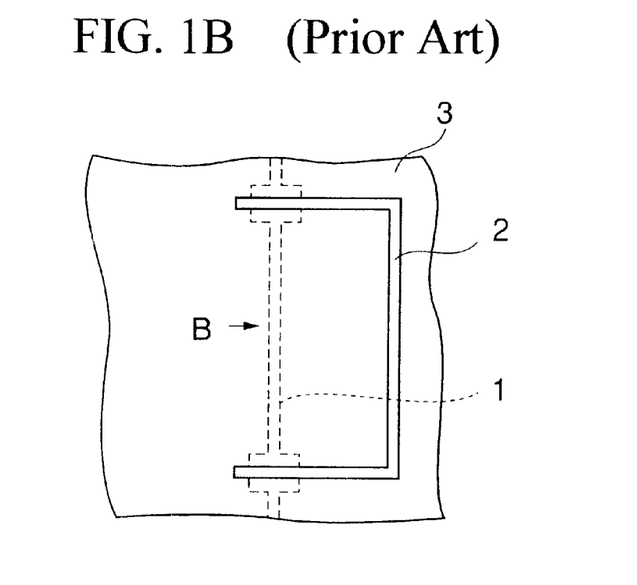
FIG. 1B is a plan view showing the arrangement of the bus line and the spare wiring in FIG. 1A.

FIG. 1A shows a sectional shape in which a drain bus line 1 and a spare wiring 2 of the LCD are formed in sequence via an insulating film 3. As shown in FIG. 1B, both end portions of the drain bus line 1 and both end portions of the spare wiring 2 are intersected with each other in the peripheral region of the display region.

Figure 1C:
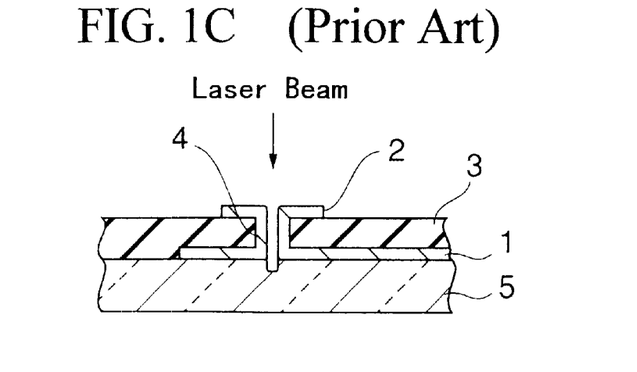
FIG. 1C is a sectional view showing a disconnection repairing method in the prior art.

If the disconnection of the drain bus line 1 is caused at a point B shown in FIG. 1B, one-shot irradiation of a laser beam is applied downward to a center of the intersecting region of the drain bus line 1 and the spare wiring 2, as shown in FIG. 1C. Thus, a hole 4 is opened through the drain bus line 1, the spare wiring 2 and the insulating film 3 and at the same time a part of the drain bus line 1 and the spare wiring 2 is melted. Then, the melted portion of the drain bus line 1 and the spare wiring 2 flows through the hole 4, so that the drain bus line 1 and the spare wiring 2 are connected to each other. As a result, conduction of the disconnected drain bus line 1 can be repaired via the spare wiring 2.

In this case, a reference 5 denotes an underlying insulating film in FIGS. 1A and 1C.

According to the above repair technology, unless the drain bus line 1 and the spare wiring 2 can be connected to each other by one-shot irradiation of the laser beam, the laser beam having the same intensity must be irradiated repeatedly. According to such laser beam irradiation, such a possibility becomes high that the intersecting portion of the drain bus line 1 and the spare wiring 2 is destroyed, so that a reliability in wiring defect repair becomes low.

Figure 2:
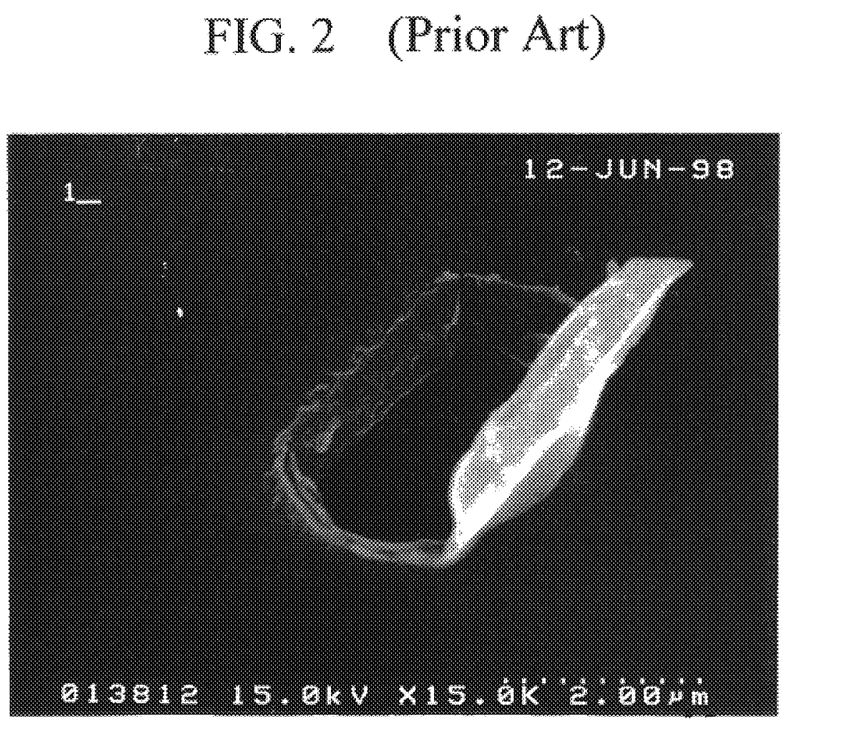
FIG. 2 is a SEM photograph showing connection of a main wiring and a spare wiring connected by the conventional method.

Also, in the conduction portion between the drain bus line 1 and the spare wiring 2, unevenness of an inner surface of the hole 4 is hardly detected by the SEM (Scanning Electron Microscope) investigation. In addition, as shown in FIG. 2, the underlying film is turned up and then remains on the peripheral region of the opening 4. After this, such turned-up film remains in the panel as a foreign matter.

SUMMARY OF THE INVENTION

It is an object of the present invention to provide an image displaying device which is capable of improving reliability in wiring defect repair and a method of manufacturing the same.

According to the present invention, upon connecting the main wiring and the spare wiring in their intersecting region, the main wiring and the spare wiring can be connected by two-step method such that the hole is formed in the main wiring and the spare wiring by the laser beam irradiation and then the main wiring and the spare wiring are melted by the laser beam irradiation whose output intensity is changed at that position. Therefore, the main wiring and the spare wiring can be connected without fail in the intersection region, and thus the reliability in repairing the wiring defect can be improved.

In this case, the laser beam is irradiated a plurality of times. However, since the intensity of the laser beam can be changed and adjusted, destruction of the intersection portion of the main wiring and the spare wiring can be prevented beforehand.

Also, in case the laser beam is irradiated onto the intersecting portion of the main wiring and the spare wiring, failure of the laser beam irradiation can be prevented by selecting the edge of the main wiring or the spare wiring as a target. In addition, if the alignment hole is formed previously in the main wiring, the spare wiring, and the protection insulating film in the intersecting portion of the main wiring and the spare wiring, alignment of the laser beam irradiation can be facilitated.

Moreover, since the connected portion of the main wiring and the spare wiring is melted gradually every laser beam irradiation to sublimate if the main wiring or the spare wiring are connected while changing the laser intensity, no rolling-up or burr of the film is caused in the connected portion of the main wiring and the spare wiring. Thus, the foreign matter is less likely to remain in the substrate.

A hole formed in the main wiring and the spare wiring by irradiating the laser beam has a rugged or unevenness inner surface.

A shape formed after such laser beam irradiation can be easily decided by the SEM investigation.

As the main wiring, for example, there are the gate bus line, the drain bus line, etc. in the liquid crystal display panel.

DETAILED DESCRIPTION OF THE PREFERRED EMBODIMENTS

Therefore, embodiments of the present invention will be explained with reference to the accompanying drawings hereinafter.

(First Embodiment)

Figure 3A:
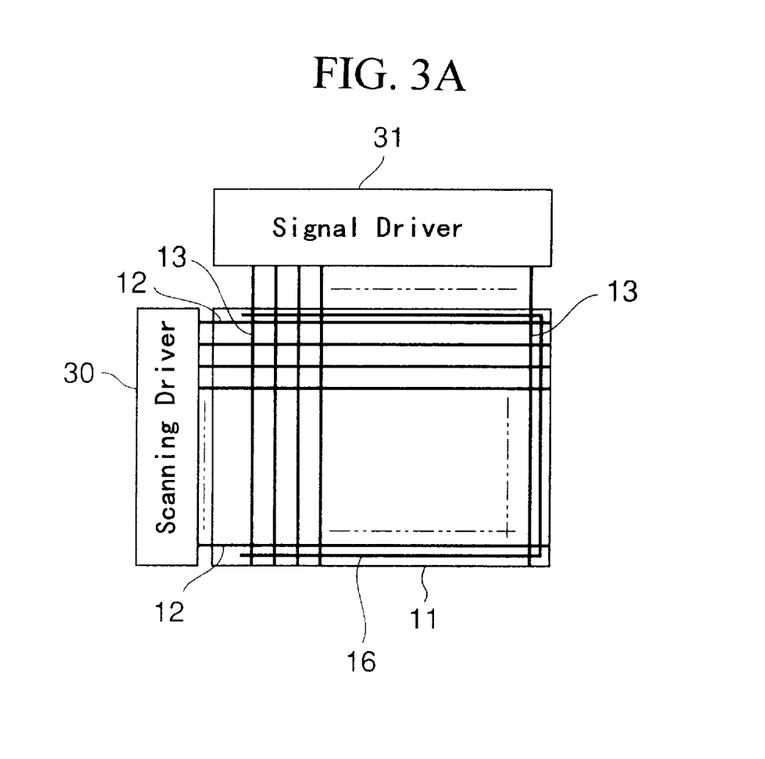
FIG. 3A is a plan view showing an arrangement of a plurality of bus lines and a spare line in a display panel according to a first embodiment of the present invention.
Figure 3B:
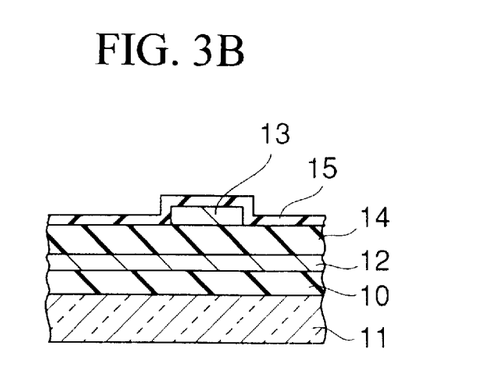
FIG. 3B is a sectional view showing a layer structure of a plurality of bus lines.
Figure 3C:
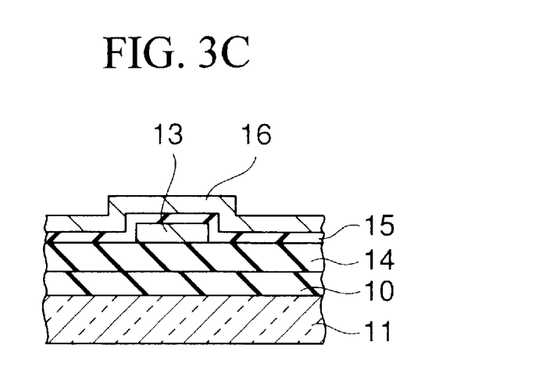
FIG. 3C is a sectional view showing a layer structure of a bus line and a spare wiring.

FIG. 3A is a plan view showing an arrangement of a gate bus line, a drain bus line and a spare line in a liquid crystal display panel according to a first embodiment of the present invention. FIG. 3B is a sectional view showing an intersecting state between the gate bus line and the drain bus line. FIG. 3C is a sectional view showing an arrangement of the drain bus line and a repairing spare wiring.

In FIG. 3A, a plurality of gate bus lines 12 and drain bus lines 13, both are formed of a metal such as chromium, aluminum, etc., are formed on a first transparent substrate 11 formed of quartz, etc. respectively.

A plurality of gate bus lines 12 are connected to a scanning driver 30, and are aligned in parallel mutually in the predetermined direction at a predetermined interval. A plurality of drain bus lines 13 are connected to a signal driver 31, and are aligned in parallel mutually at another predetermined interval so as to intersect with the gate bus lines 12.

As shown in FIG. 3B, the gate bus line 12 and the drain bus line 13 are formed in order to be insulated by a first interlayer insulating film 14. The drain bus line 13 is then covered with a second interlayer insulating film 15. As shown in FIG. 3C, a spare wiring 16 is formed on the second interlayer insulating film 15.

As shown in FIG. 3A, the spare wiring 16 is formed like a U-shape along an external periphery of the first transparent substrate 11 such that such spare wiring 16 passes over a plurality of drain bus lines 13 so as to detour the pixel region.

Figure 4A:
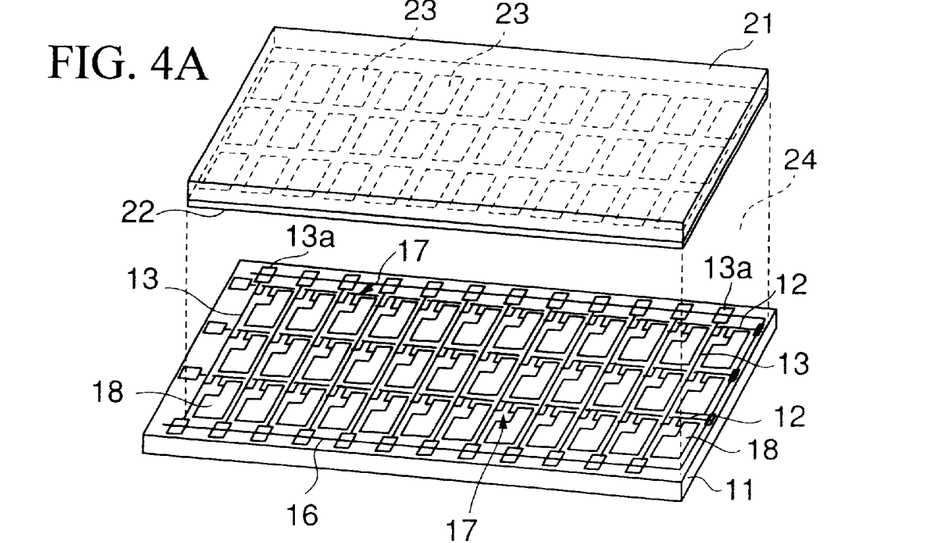
FIG. 4A is a perspective exploded view showing the display panel according to the first embodiment of the present invention.

As shown in FIG. 4A, a drain line pad 13a is formed on one end of the drain bus line 13. Then, a data terminal of the signal driver 31 is connected to the drain line pad 13a.

Figure 4B:
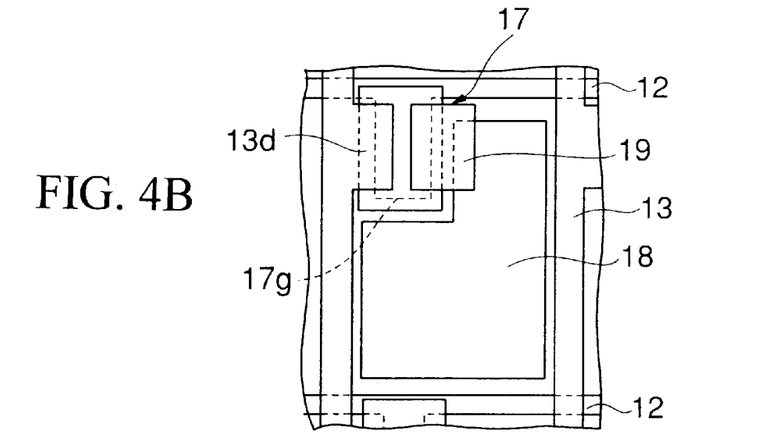
FIG. 4B is a plan view showing a structure of one pixel region formed in the display panel in FIG. 4A.
Figure 4C:
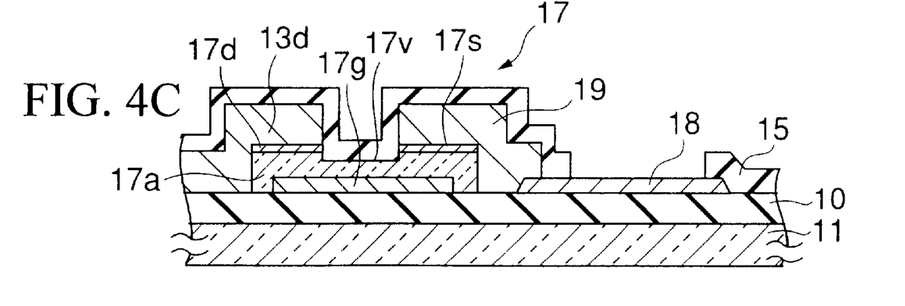
FIG. 4C is a sectional view showing the structure of one pixel region shown in FIG. 4B.

Moreover, as shown in FIGS. 4B and 4C, a thin film transistor (TFT) 17 is arranged in the neighborhood of respective intersecting portions of a plurality of gate bus lines 12 and a plurality of drain bus lines 13.

In FIG. 4A, a surface of the first transparent substrate 11 on which the TFT 17, the bus lines 12, 13, etc. are arranged is placed to face to a transparent common electrode 22 formed on the second transparent substrate 21. For example, trichromatic color filters 23 are also arranged on the second transparent substrate 21. Then, a liquid crystal 24 is injected into a clearance between the first transparent substrate 11 and the second transparent substrate 21.

For example, as shown in FIGS. 4B and 4C, the TFT 17 has a structure in which the drain is connected to the drain bus line 13 and the source is connected to a pixel electrode 18 which is formed of transparent (light transmissible) conductive material such as ITO (Indium Tin Oxide).

The TFT 17 is formed on the first transparent substrate 11 and on an underlying insulating film 10 which covers a storage capacitor electrode (not shown). A gate electrode 17g of the TFT 17 has a shape which is projected sideward from the gate bus line 12. An n-type or p-type active semiconductor film 17a made of polysilicon or amorphous silicon is formed on the gate electrode 17g. Then, a drain layer 17d and a source layer 17s, which have a conductivity type opposite to the active semiconductor film 17a, are formed on the active semiconductor film 17a so as to be separated by a groove 17v mutually. The drain layer 17d is connected to a drain electrode 13d which is projected sideward from the drain bus line 13. A source electrode 19 which extends toward the pixel electrode 18 is also formed on the source layer 17s. The TFT 17 having the above structure is covered with a third interlayer insulating film 15.

The above spare wirings 16 are arranged so as to intersect with each other in the neighborhood of both ends of a plurality of drain bus lines 13. In the intersecting portions, it is preferable that a pad should be provided on the drain bus line 13 side as shown in FIGS. 5A, 5B, or a pad should be provided on the spare wiring 16 side as shown in FIGS. 6A, 6B.

Figure 5A:
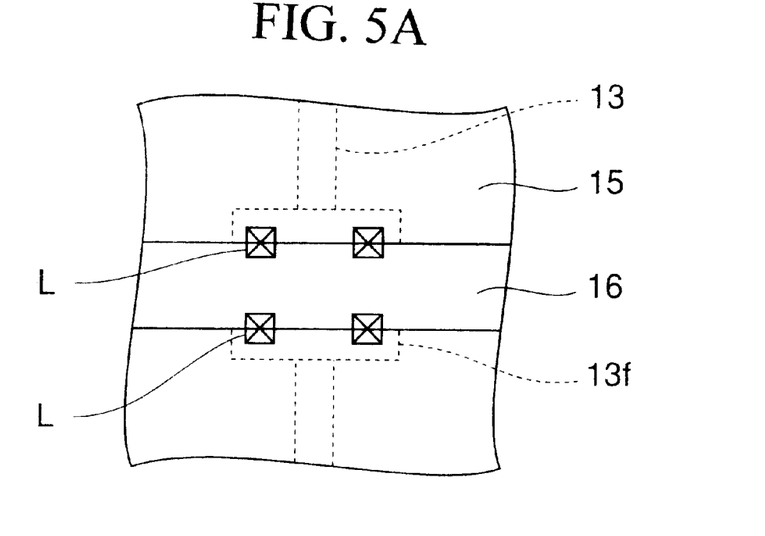
FIGS. 5A, 5B are plan views each showing a first arrangement of the bus line and the spare wiring employed in the display panel according to the first embodiment of the present invention.
Figure 5B:
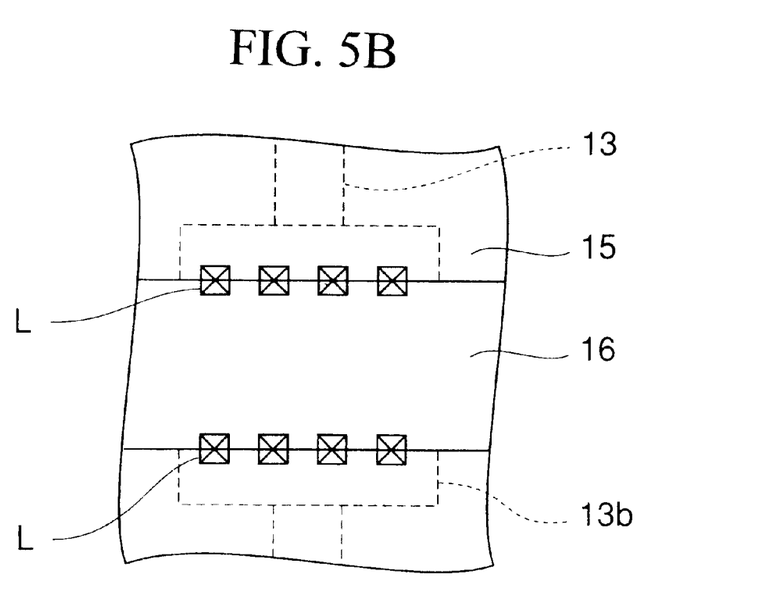

In other words, as shown in FIG. 5A, a first pad 13f is formed on an intersecting portion of the drain bus line 13 located on the data terminal forming side and the spare wiring 16. As shown in FIG. 5B, a second pad 13b is formed on an intersecting portion of the drain bus line 13 located on the data terminal non-forming side and the spare wiring 16. The first pad 13f and the second pad 13b may be separately formed under the third interlayer insulating film 15. For example, if an insulating film (not shown) is formed between the first pad 13f and the drain bus line 13 and the second pad 13b and the drain bus line 13 respectively, the first pad 13f and the second pad 13b are connected to the drain bus line 13 via a via (not shown) formed in the insulating film.

Figure 6A:
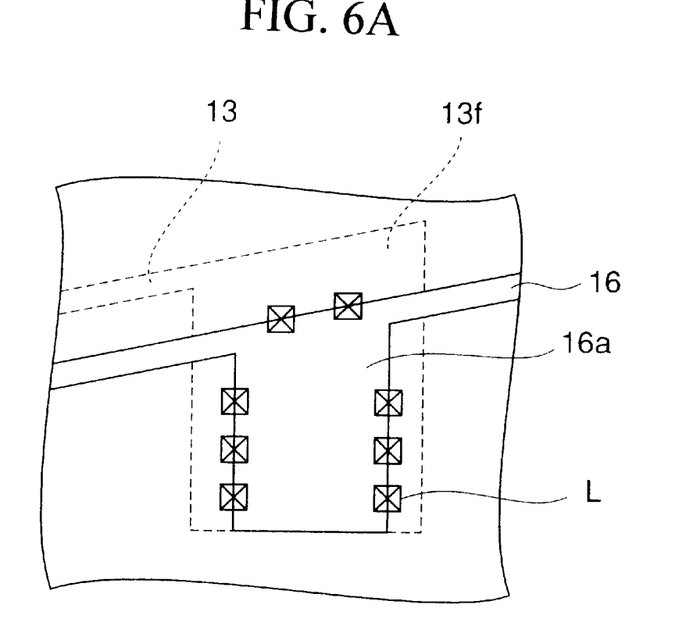
FIGS. 6A, 6B are plan views each showing a second arrangement of the bus line and the spare wiring employed in the display panel according to the first embodiment of the present invention.
Figure 6B:
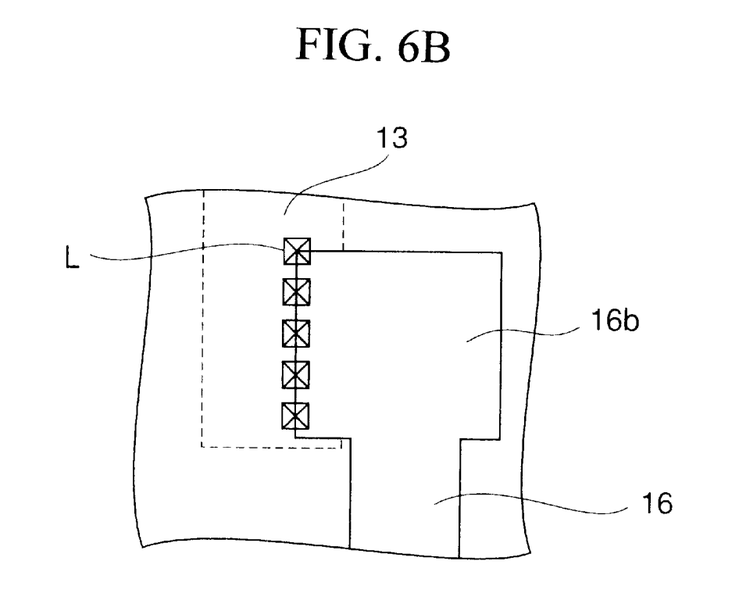

Also, as shown in FIGS. 6A, 6B, a third pad 16a and a fourth pad 16b may be provided on both ends of the spare wiring 16 respectively. FIG. 6A shows the spare wiring 16 formed on the data terminal forming side of the drain bus line 13. FIG. 6B shows the spare wiring 16 formed on the data terminal non-forming side of the drain bus line 13.

All the above pads 13a, 13b, 13f, 16a, 16b are formed of conductive material.

Next, in the event that disconnection is caused in one of the drain bus lines 13 during the steps of manufacturing the liquid crystal display panel, a method of repairing a function of the drain bus line 13 will be explained, hereinafter.

Figure 7:
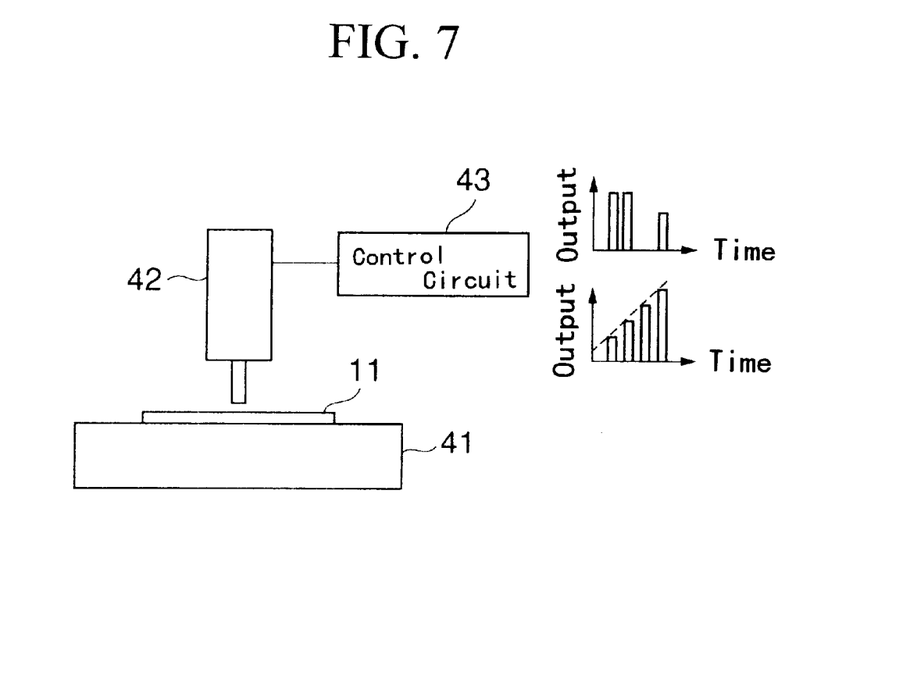
FIG. 7 is a schematic view showing a laser device employed in the first embodiment of the present invention.
Figure 8:
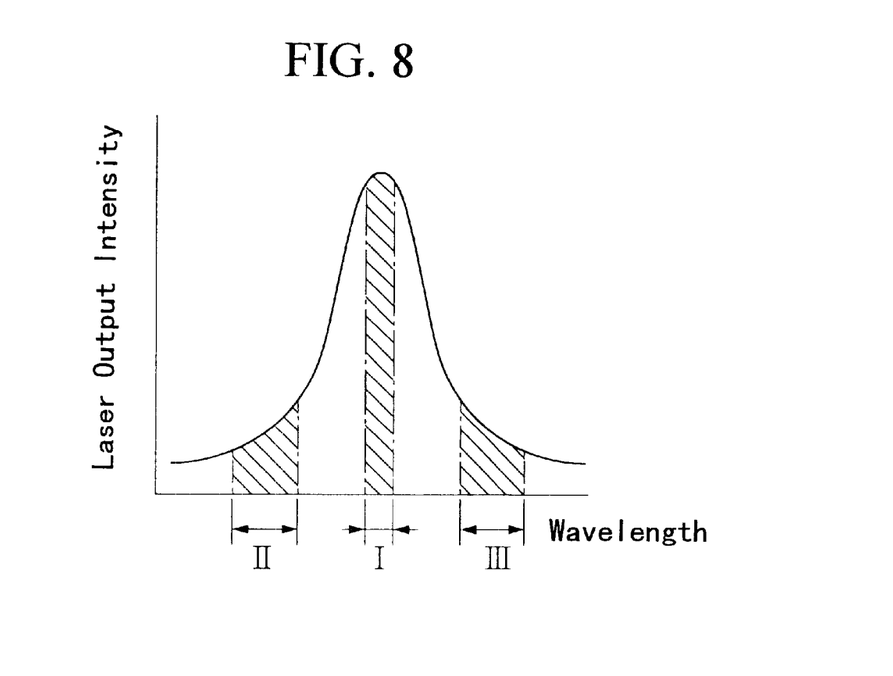
FIG. 8 is a graph showing a relationship between an output wavelength and an output intensity in the laser device employed in the first embodiment of the present invention.

First, the first transparent substrate 11 having the drain bus lines 13 is loaded on a stage 41 of the repair device shown in FIG. 7. A laser 42 for outputting the laser beam is placed over the stage 41. An output of the laser 42 and the number of shots of the laser can be controlled by a control circuit 43. The laser 42 has a structure that can vary an output intensity of the laser beam by controlling the wavelength. As shown in FIG. 8, the laser output intensity of the laser 42 has substantially a Gaussian distribution relative to the output wavelength.

Next, with the use of the microscope (not shown), a portion of the disconnected drain bus line 13, which intersects with the spare wiring 16, is positioned in the emitting direction of the laser 42. Planer surfaces of such intersecting portions are shown in FIGS. 5A, 5B and FIGS. 6A, 6B as above.

Figure 9A:
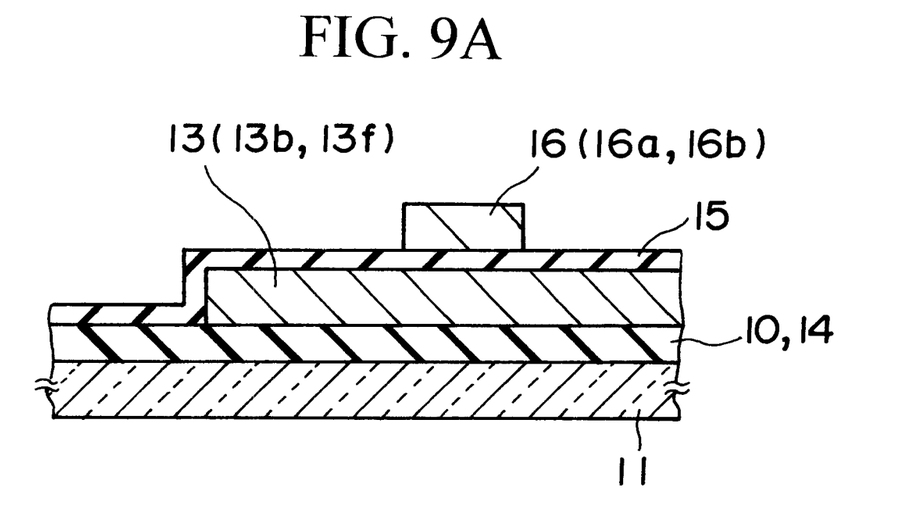
FIGS. 9A to 9D are sectional views showing a method of connecting the bus line and the spare wiring in the display panel according to the first embodiment of the present invention.

The intersecting portion which is positioned on a laser beam irradiation region for the laser 42 has the sectional shape shown in FIG. 9A, for example.

In this state, the laser beam is irradiated to a plurality of laser beam irradiation regions L, which are located on edge portions of the spare wiring 16, out of the intersecting region of the first pad 13f located on the data terminal forming side of the drain bus line 13 and the spare wiring 16, as shown in FIG. 5A, for example.

The laser beam irradiation is performed in two steps as follows.

Figure 9B:
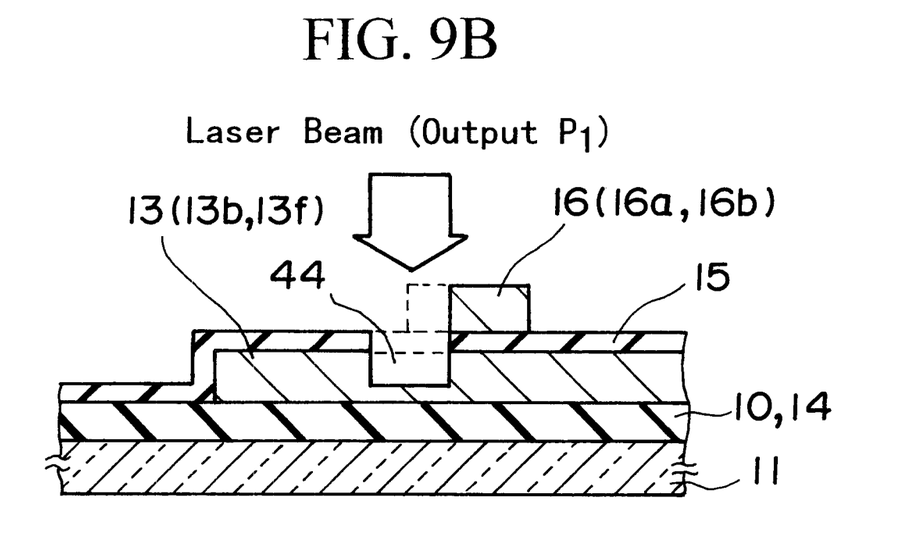
Figure 9C:
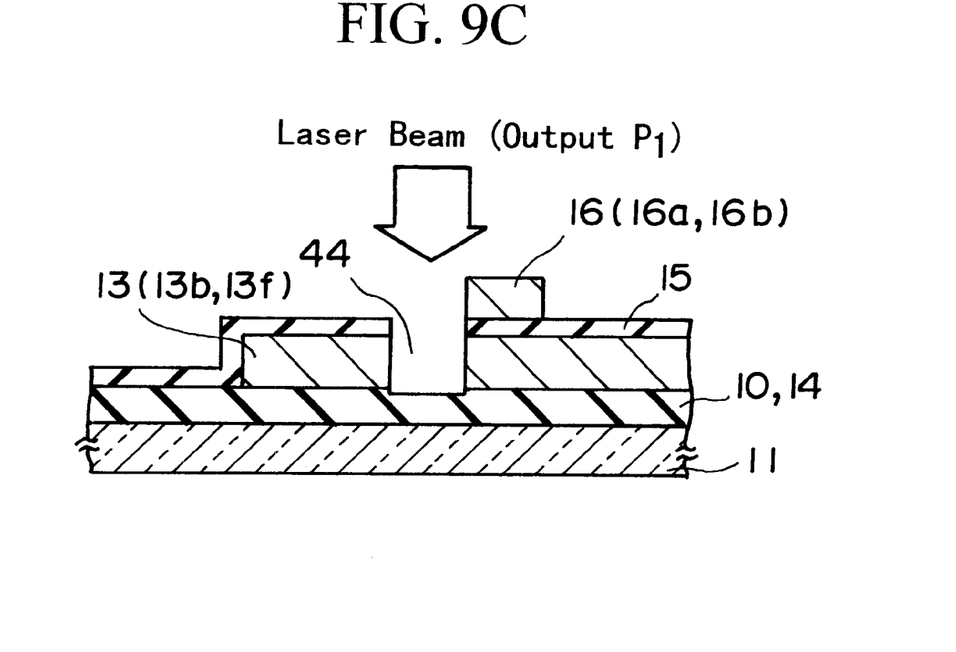

In the first stage, the output wavelength of the laser 42 is adjusted into the wavelength band II or III in FIG. 8 by the control circuit 43 to output the laser beam, which has a magnitude of 0.5 to 1.0 mJ/pulse, preferably 0.7 to 0.9 mJ/pulse, from the laser 42. Then, the laser beam is irradiated onto the laser beam irradiation regions L. Hence, as shown in FIG. 9B, a hole 44 which is passed through the drain bus line 13, the spare wiring 16, and the third interlayer insulating film 15 is formed. In this case, as shown in FIG. 9C, the hole 4 may be formed deeper by irradiating the laser beam with the same intensity plural times.

In this first stage, since the intensity of the laser beam is low, such a possibility is small that a melted portion of the spare wiring 16 is mixed with a melted portion of the drain bus line 13 through the hole 44.

Therefore, in the second stage, the output wavelength of the laser 42 is adjusted into the wavelength band I in FIG. 8 by the control circuit 43 to output the laser beam, which has a magnitude of 0.8 to 1.8 mJ/pulse, preferably 1.2 to 1.5 mJ/pulse, from the laser 42. Such magnitude can be selected to melt constituting materials of the spare wiring 16 and the drain bus line 13 and then render them to flow into the hole 44. Then, the laser beam is irradiated onto the laser beam irradiation regions L.

Figure 9D:
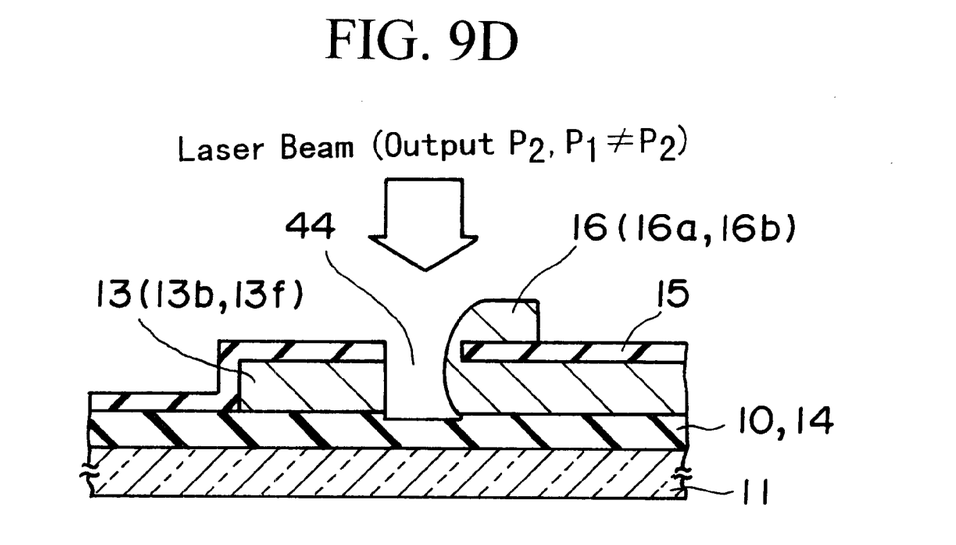

Consequently, as shown in FIG. 9D, a melted portion of the spare wiring 16 flows into the hole 44 and then is mixed with a melted portion of the drain bus line 13. Thus, reliability in wiring defect repair can be improved rather than the prior art.

Such laser beam irradiation is also applied to the drain bus line 12 located on the data terminal non-forming side and the spare wiring 16, as shown in FIG. 5B. In this case, the laser beam irradiation may be applied from the data terminal forming side as described above, or may be applied from the data terminal non-forming side.

As mentioned above, if first the hole 44 is opened in the drain bus line 13 and the spare wiring 16 by the laser beam irradiation of low intensity and then melted portions of the drain bus line 13 and the spare wiring 16 are connected mutually through the hole 44 by the laser beam irradiation of high intensity, it is possible to send out from the signal driver 31 to the entire area of the disconnected drain bus line (main wiring) 13 via the spare wiring 16.

Also, if an edge of the spare wiring 16 is set as a laser beam irradiation position, the laser beam irradiation position can be easily detected. Thus, the laser beam can be irradiated while using the edge as a mark.

Figure 10A:
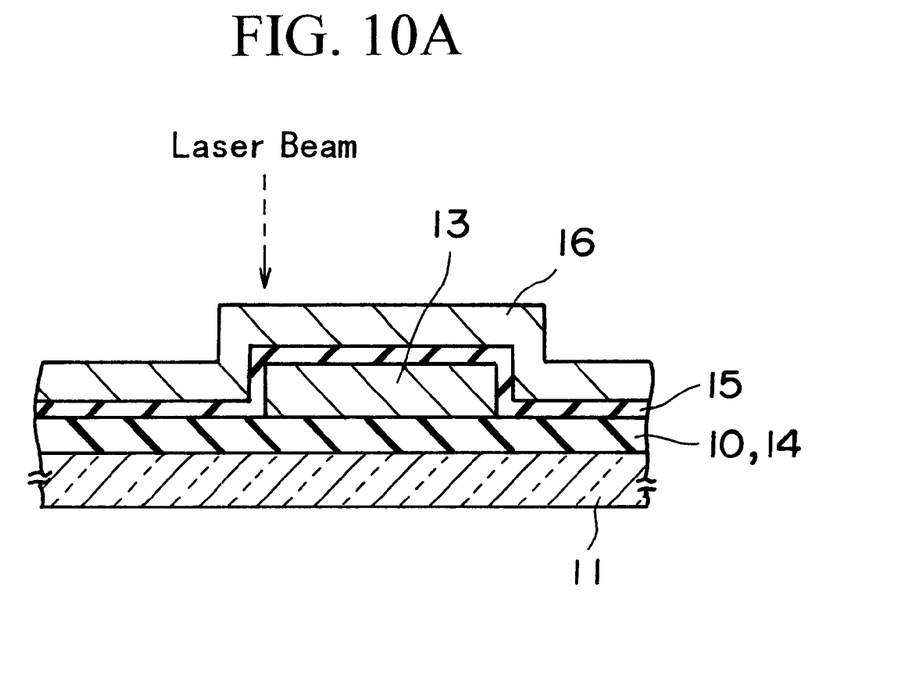
FIGS. 10A, 10B are sectional views showing an example wherein a laser beam irradiation position onto the bus line and the spare wiring is aligned with an edge of the bus line in the display panel according to the first embodiment of the present invention.
Figure 10B:
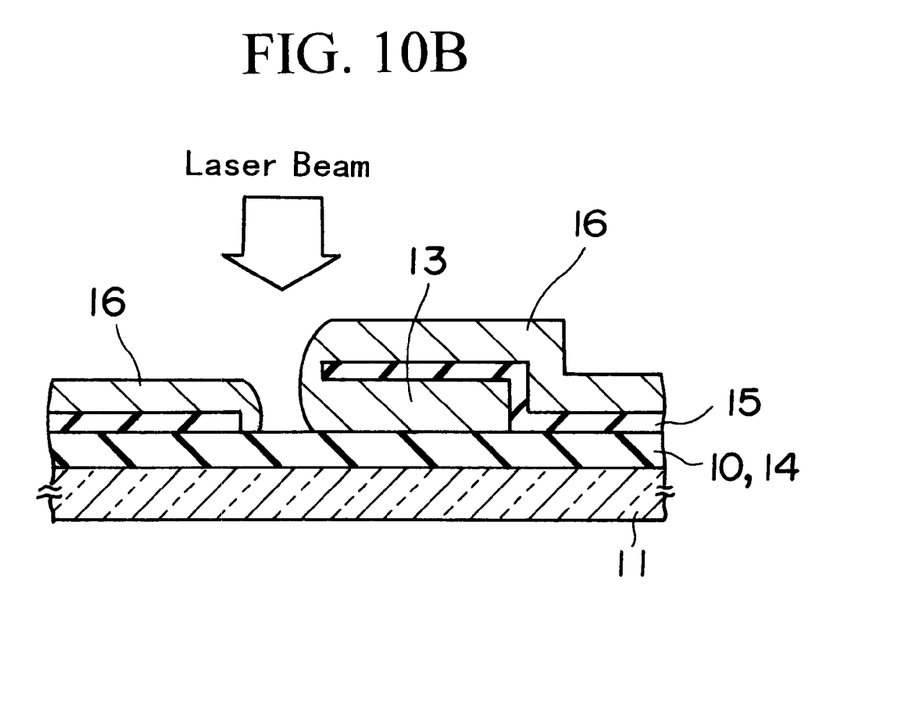

Meanwhile, the laser beam irradiation position is not limited to the edge of the spare wiring 16. For example, the laser beam may be irradiated onto an edge of the drain bus line 13. The drain bus line 13 is positioned below the spare wiring 16, but a position of the edge of the drain bus line 13 can be easily detected because, as shown in FIG. 10A, such edge of the drain bus line 13 appears as a step on the spare wiring 16. A sectional shape formed after the laser beam has been irradiated onto the edge of the spare wiring 16 with changing its intensity in two steps can be given as shown in FIG. 10B.

In the above explanation, only one spare wiring 16 is provided on the first transparent substrate 11. However, a plurality of spare wirings 16 may be arranged in parallel. In addition, in the above explanation, an example wherein the drain bus line 13 and the spare wiring 16 are connected to each other is explained. However, both ends of the gate drain bus 12 may be connected via the spare wiring.

Further, in the above explanation, upon irradiating the laser beam, first the irradiation intensity is set low and then the final irradiation intensity is set high. On the contrary, in a second method first the irradiation intensity is set high and then the irradiation intensity is set low.

The second method, in which the intensity of the first laser beam is larger than the intensity of the later laser beam, is less stable for the main and spare wirings than the first method, in which the intensity of the later laser beam is larger than the first laser beam. However, the melting states formed by the first and second methods are much the same.

Furthermore, such a method may be adopted that, when the laser beam irradiation is made plural times, the irradiation intensity can be decreased gradually or the irradiation intensity can be enhanced gradually.

If the first laser beam is high intensity, the first laser beam makes a burr protruding the main wiring or the spare wiring. When the later laser beam, which is lower intensity than the first laser beam, is irradiated to the main wiring or the spare wiring, the burr disappears almost. The single or repeated laser beam shot, which is lower than the first laser beam shot, makes the wiring melt.

If the later laser beam shot has intensity higher than the first laser beam shot, the burr is not formed on the main or spare wiring by the first laser beam shot, and the later laser beam shot makes the main and spare wirings melt and connect stably with each other. All the laser beam shots only having lower power intensity do not penetrate the main and spare wirings and make the main and spare wirings connect each other.

(Second Embodiment)

In the first embodiment of the present invention, the laser beam irradiation position is set to the edge of the spare wiring 16 and its peripheral area. In a second embodiment of the present invention, the laser beam irradiation position is set to an inside of the spare wiring 16 and its peripheral area by adopting a structure described in the following.

Figure 11A:
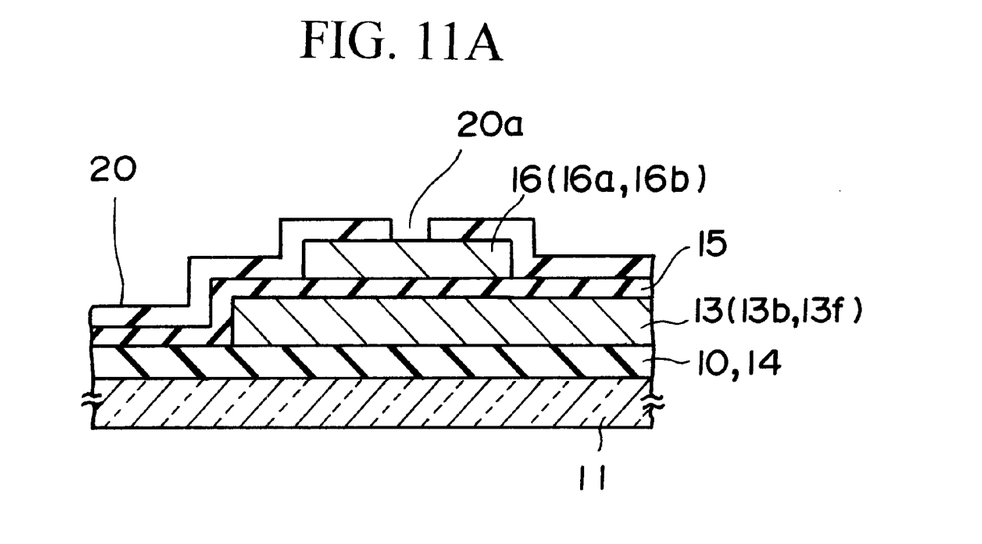
FIG. 11A is a sectional view showing an arrangement of a bus line and a spare wiring employed in a display panel according to a second embodiment of the present invention.
Figure 11B:
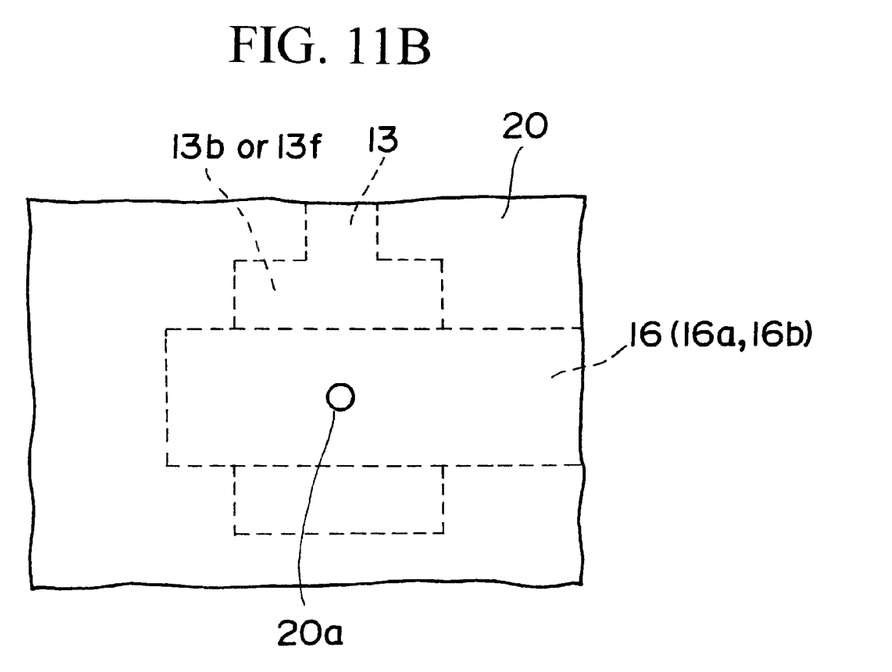
FIG. 11B is a plan view showing the arrangement of the bus line and the spare wiring employed in the display panel shown in FIG. 11A.

FIGS. 11A and 11B shows a structure in which an alignment hole 20a is formed in a protection insulating film 20 covering the spare wiring 16 in the inside (e.g., center) of the intersecting region of the spare wiring 16 and the drain bus line 13.

Figure 12A:
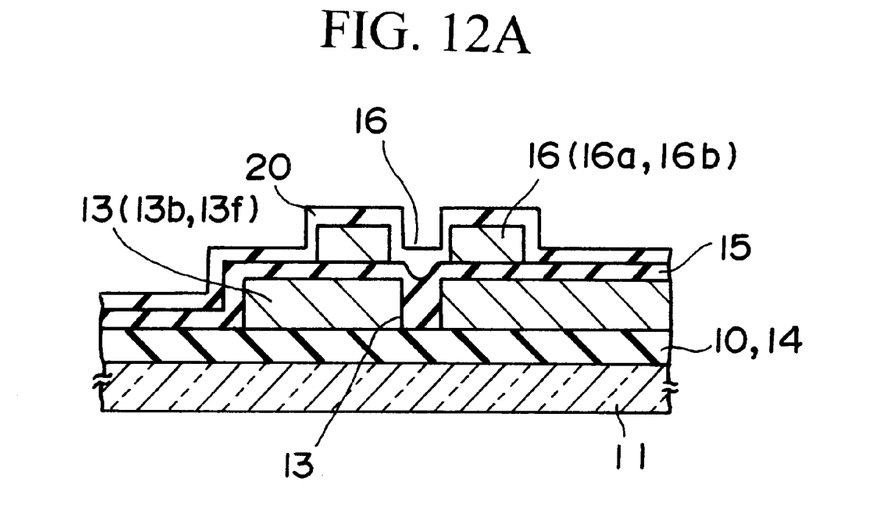
FIG. 12A is a sectional view showing another arrangement of the bus line and the spare wiring employed in the display panel according to the second embodiment of the present invention.
Figure 12B:
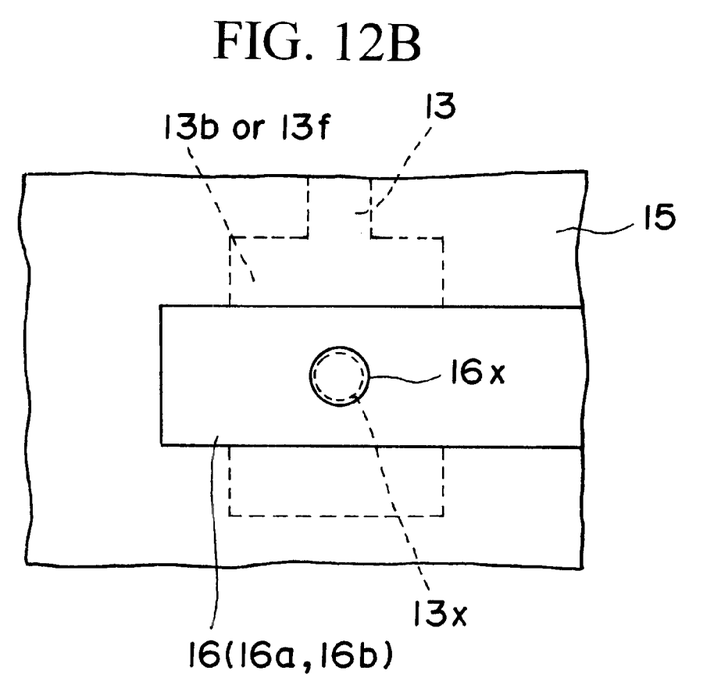
FIG. 12B is a plan view showing the arrangement of the bus line and the spare wiring employed in the display panel shown in FIG. 12A.

FIGS. 12A and 12B shows a structure in which a first alignment hole 13x is provided in the drain bus line 13 in the inside of the intersecting region of the spare wiring 16 and the drain bus line 13 and then a second alignment hole 16x is provided in the spare wiring 16 such that the second alignment hole 16x is superposed on the first alignment hole 13x vertically.

Then, if the laser beam is irradiated onto the spare wiring 16 and the drain bus line 13, positioning of the laser beam irradiation can be facilitated by directing the laser 42 toward these alignment holes 20a, 13x, 16x. That is, because a trace of the hole can be detected by the microscope, etc. if any one of these alignment holes 20a, 13x, 16x exists, alignment of the laser beam irradiation position can be made easy.

Figure 13A:
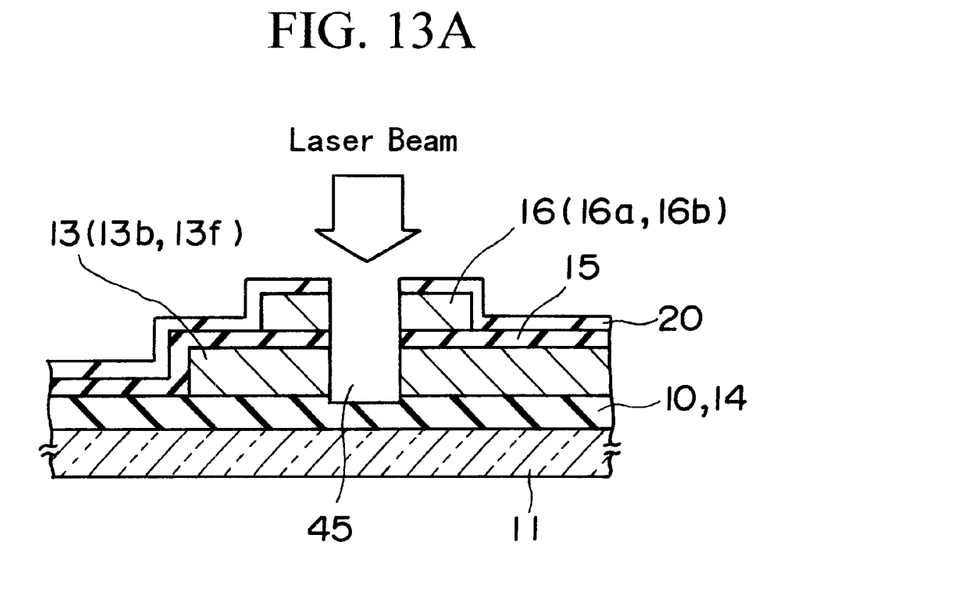
FIGS. 13A, 13B are sectional views showing a method of connecting the bus line and the spare wiring in the display panel according to the second embodiment of the present invention.
Figure 13B:
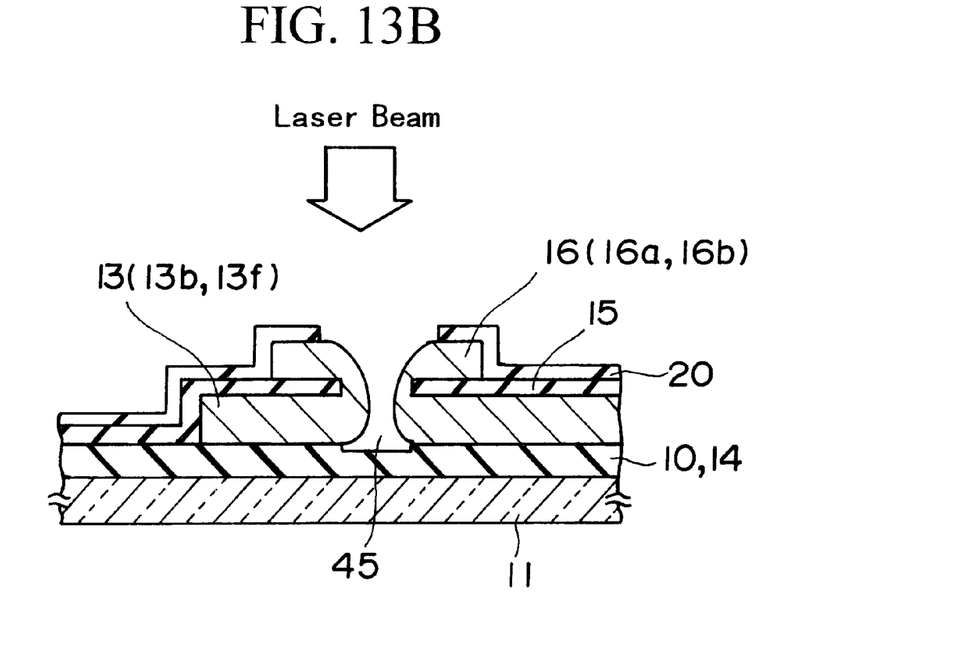

In FIGS. 11A and 12A, if the drain bus line 13 and the spare wiring 16 are connected to each other, a hole 45 is opened in the spare wiring 16 and the drain bus line 13, as shown in FIG. 13A, by irradiating the laser beam to the alignment holes 20a, 13x, 16x. Then, the intensity of the laser beam is increased and, as shown in FIG. 13B, irradiated portions of the spare wiring 16 and the drain bus line 13 are melted to be connected to each other.

Figure 14:
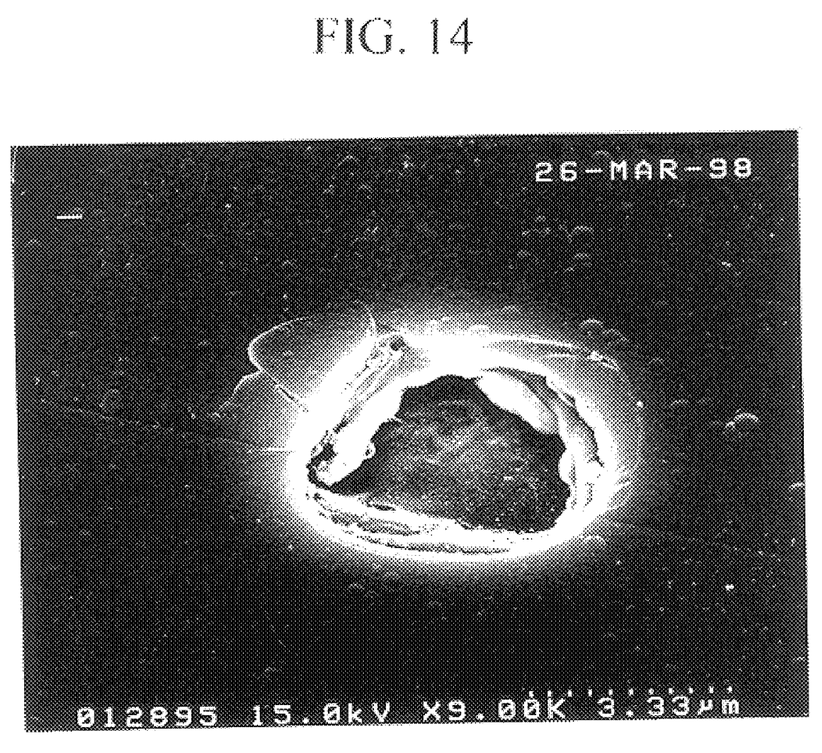
FIG. 14 is a SEM photograph showing an example of a connected portion of a main wiring and a spare wiring according to the present invention.

As explained above in the first and second embodiments, when the bus line and the spare wiring are connected by irradiating the laser beam while changing the laser intensity in two steps, rolling-up of the film does not appear in the connected portion but unevenness or rugged face appears on the inner periphery of the hole in the connected portion, as shown in a SEM photograph of FIG. 14.

In the above embodiments, the method of repairing the disconnection of the main wiring of the liquid crystal display panel is explained. However, the above method of repairing the disconnection may also be applied when wirings provided around the pixel in other flat panels are disconnected.

As described above, according to the present invention, in order to connect the main wiring and the spare wiring in their intersecting region, the main wiring and the spare wiring can be connected by two-step method such that the hole is formed in the main wiring and the spare wiring by the laser beam irradiation and then the main wiring and the spare wiring are melted by the laser beam irradiation whose output intensity can be changed. Therefore, the main wiring and the spare wiring can be connected without fail in the intersection region, and thus the reliability in repairing the wiring defect can be improved.

In this case, the laser beam is irradiated plural times. However, since the intensity of the laser beam can be changed and adjusted, destruction of the intersection portion of the main wiring and the spare wiring can be prevented previously.

What is claimed is:

1. A method of repairing a disconnected wiring, which has a step of connecting a main wiring, in which disconnection is caused, and a spare wiring, which is formed on or under the main wiring via an interlayer insulating film, in their intersecting region of the main wiring and the spare wiring, the method comprising the steps of:

opening a hole by irradiating a laser beam of a first output intensity from a laser to the intersecting region of the main wiring and the spare wiring; and connecting the spare wiring and the main wiring by melting a part of the spare wiring and the main wiring by irradiating a laser beam of a second output intensity, which is higher than the first output intensity, toward the hole.

2. A method of manufacturing an image displaying device according to claim 1, further comprising the step of forming a conductive pad, which is connected to one of the main wiring and the spare wiring, in the intersecting region.

3. A method of repairing a disconnected wiring according to claim 1, wherein irradiation of the laser beam of the first output intensity is performed a plurality of times to open the hole.

4. A method of repairing a disconnected wiring according to claim 1, wherein the laser has such a characteristic that an output intensity of the laser beam can be adjusted by changing an output wavelength.

5. A method of repairing a disconnected wiring according to claim 1, wherein the laser beam of a third output intensity which is set between the first output intensity and the second output intensity is further irradiated toward the hole.

6. A method of repairing a disconnected wiring according to claim 1, wherein an irradiation position of the laser beam is at least one of an edge of the spare wiring and an edge of the main wiring in the intersecting region.

7. A method of repairing a disconnected wiring according to claim 1, further comprising the steps of:

forming a protection insulating film to cover the spare wiring;

forming an alignment hole in the protection insulating film in a part of the intersecting region; and irradiating the laser beam toward the alignment hole.

8. A method of repairing a disconnected wiring according to claim 1, further comprising the steps of:

forming an alignment hole in at least one of the main wiring and the spare wiring in the intersecting region; and irradiating the laser beam toward the alignment hole.

9. A method of repairing a disconnected wiring according to claim 1, wherein the main wiring is a drain bus line or a gate bus line of a liquid crystal display.

10. A method of repairing a disconnected wiring according to claim 1, wherein the spare wiring is formed in a peripheral region of a display region to detour the display region of a display device.

* * * * *